United States Patent
Snider

(10) Patent No.: US 7,292,498 B2
(45) Date of Patent: Nov. 6, 2007

(54) FACTORED NANOSCALE MULTIPLEXER/DEMULTIPLEXER CIRCUIT FOR INTERFACING NANOWIRES WITH MICROSCALE AND SUB-MICROSCALE ELECTRONIC DEVICES

(75) Inventor: Gregory S. Snider, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 132 days.

(21) Appl. No.: 11/123,551

(22) Filed: May 6, 2005

(65) Prior Publication Data

US 2006/0250878 A1   Nov. 9, 2006

(51) Int. Cl.
H03K 17/00 (2006.01)
G11C 7/00 (2006.01)
G11C 7/10 (2006.01)
G11C 8/00 (2006.01)
B82B 1/00 (2006.01)

(52) U.S. Cl. .......................... 365/230.02; 365/189.02; 327/407; 327/415; 977/940; 977/932

(58) Field of Classification Search ........... 365/230.02, 365/189.02, 230.03; 327/407, 415; 977/940, 977/932

See application file for complete search history.

(56) References Cited

U.S. PATENT DOCUMENTS 6,128,214 A * 10/2000 Kuekes et al. .............. 365/151
6,256,767 B1    7/2001 Kuekes et al.
6,314,019 B1 * 11/2001 Kuekes et al. .............. 365/151
6,559,468 B1 *  5/2003 Kuekes et al. ................ 257/14
6,952,358 B2 * 10/2005 Snider ......................... 365/49

OTHER PUBLICATIONS

Millman et al., Microelectronics, 2nd Ed., McGraw-Hill, 1987, pp. 283-286.*

* cited by examiner

Primary Examiner—J. H. Hur

(57) ABSTRACT

Embodiments of the present invention are related to nanoscale multiplexers and demultiplexers that employ randomly fabricated interconnections between nanowire signal lines and microscale or sub-microscale address lines. A greater number of address lines than a minimal number of address lines needed for unique addressing in a deterministic, non-randomly fabricated multiplexer or demultiplexer are used. The number of address lines in excess of the minimal number of address lines needed for unique addressing in a deterministic multiplexer or demultiplexer are referred to as supplemental address lines. The number of supplemental address lines needed for a randomly fabricated nanoscale multiplexer or demultiplexer can be decreased by employing two stages within the multiplexer or demultiplexer, the first stage having deterministically fabricated interconnections between signal lines and a first set of address lines, and the second stage having randomly fabricated interconnections between signal lines and a second set of address lines.

21 Claims, 13 Drawing Sheets

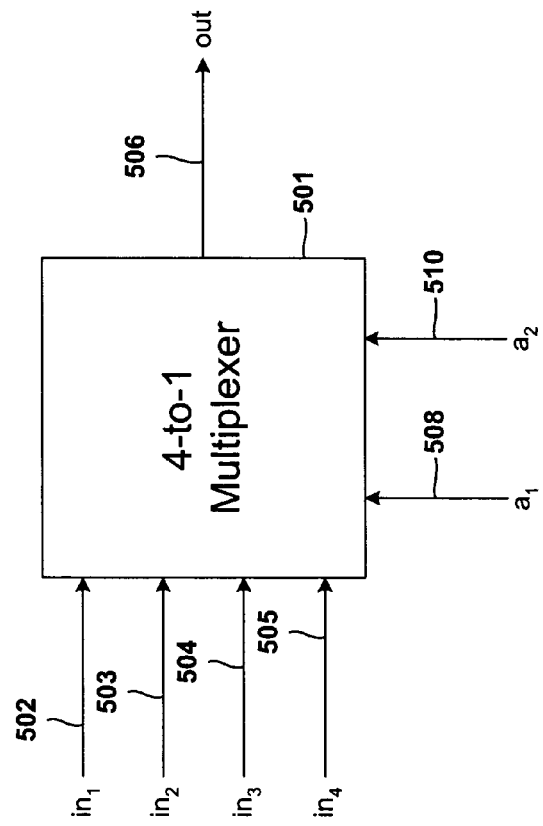
Figure 5C
Figure 5B
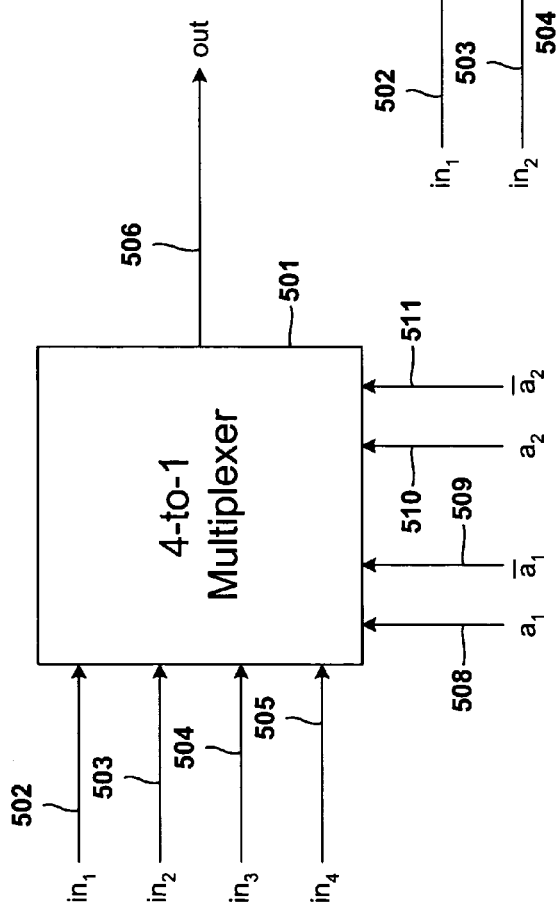
Figure 5A

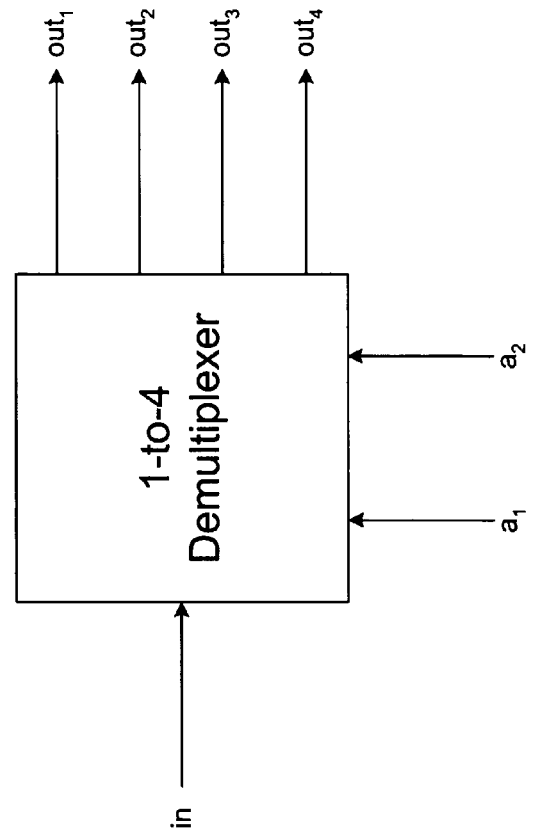
Figure 6C
Figure 6B
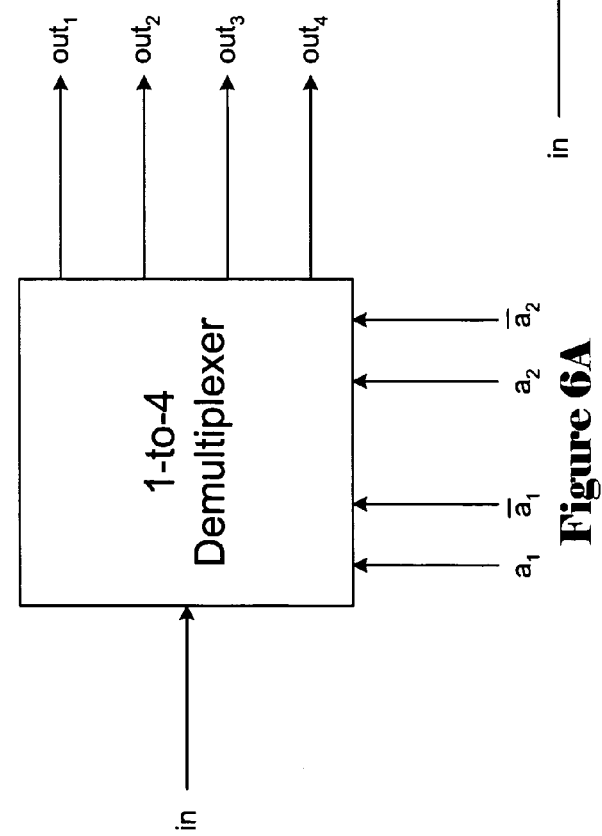
Figure 6A

FACTORED NANOSCALE MULTIPLEXER/DEMULTIPLEXER CIRCUIT FOR INTERFACING NANOWIRES WITH MICROSCALE AND SUB-MICROSCALE ELECTRONIC DEVICES

TECHNICAL FIELD

The present invention relates to electronic multiplexers and demultiplexers, and, in particular, to multiplexer/demultiplexer circuits configured from nanowire crossbars.

BACKGROUND OF THE INVENTION

During the past fifty years, the electronics and computing industries have been relentlessly propelled forward by ever decreasing sizes of basic electronic components, such as transistors and signal lines, and by correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding and expensive higher-energy-radiation-based technologies may need to be employed to create smaller components using photolithographic techniques. Expensive semiconductor fabrication facilities may need to be rebuilt in order to use the new techniques. Many new obstacles are also expected to be encountered. For example, it is necessary to fabricate semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor surfaces decrease, resulting in an increasing proportion of defective devices during manufacture, and a correspondingly lower yield of useful product. Ultimately, various quantum effects that arise only at molecular-scale distances may altogether overwhelm current approaches to component fabrication in semiconductors.

In view of these problems, researchers and developers have expended considerable research effort in fabricating sub-microscale and nanoscale electronic devices using alternative technologies. Nanoscale electronic devices generally employ nanoscale signal lines having widths, and nanoscale components having dimensions, of less than 100 nanometers. More densely fabricated nanoscale electronic devices may employ nanoscale signal lines having widths, and nanoscale components having dimensions, of less than 50 nanometers, and, in certain types of devices, less than 10 nanometers. A nanoscale electronic device may include sub-microscale, microscale, and larger signal lines and components.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits using current technologies. Even were such straightforwardly miniaturized circuits able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. Thus, new implementation strategies and techniques need to be employed to develop and manufacture useful circuits and structures at nanoscale dimensions using nanowires.

Designers and manufacturers of nanoscale electronic devices have recently begun implementing multiplexer/demultiplexer circuits at the nanoscale level. One possible use for multiplexer/demultiplexer circuits is for interfacing signal nanowires with microscale or sub-microscale address lines. The number of address lines needed to uniquely address each of M nanowire signal lines with a high degree of probability in current nanoscale multiplexer/demultiplexer circuits implemented using randomly fabricated interconnections is $k \log_2 M$, where k is a value that represents an increase in the number of address lines needed for nanoscale multiplexer/demultiplexer circuits using randomly fabricated interconnections over the number of address lines needed for nanoscale multiplexer/demultiplexer circuits using non-randomly, or deterministically fabricated interconnections. For nanoscale multiplexer/demultiplexer circuits with significant line-gauge differences, it is often advantageous to employ small numbers of microscale or sub-microscale address lines. Designers, manufacturers, and users of electrical systems integrating nanowires within microscale or sub-microscale electronic devices have, therefore, recognized the need for decreasing the number of microscale or sub-microscale address lines used to uniquely address M nanowires of a nanoscale electronic device using random interconnections.

SUMMARY OF THE INVENTION

Embodiments of the present invention are related to nanoscale multiplexers and demultiplexers that employ randomly fabricated interconnections between nanowire signal lines and microscale or sub-microscale address lines. A greater number of address lines than a minimal number of address lines needed for unique addressing in a deterministic, non-randomly fabricated multiplexer or demultiplexer are used. The number of address lines in excess of the minimal number of address lines needed for unique addressing in a deterministic multiplexer or demultiplexer are referred to as supplemental address lines. The number of supplemental address lines needed for a randomly fabricated nanoscale multiplexer or demultiplexer can be decreased by employing two stages within the multiplexer or demultiplexer, the first stage having deterministically fabricated interconnections between signal lines and a first set of address lines, and the second stage having randomly fabricated interconnections between signal lines and a second set of address lines.

BRIEF DESCRIPTION OF THE DRAWINGS

FIGS. 5A-5B illustrate two exemplary 4-input-line-to-1-output-line, or 4-to-1, multiplexers.

FIG. 5C shows a truth table indicating how the values of the two address inputs "$a_1$" and "$a_2$" determine the state of the output signal line by the 4-to-1 multiplexer shown in FIGS. 5A-5B.

FIGS. 6A-6B illustrate two exemplary 1-to-4 demultiplexers.

FIG. 6C illustrates a truth table indicating how the values of the two address inputs "$a_1$" and "$a_2$" determine the output path of the input signal line by the 1-to-4 demultiplexer shown in FIGS. 6A-6B.

DETAILED DESCRIPTION OF THE INVENTION

Various embodiments of the present invention are directed to a factored nanoscale multiplexer/demultiplexer circuit. A two-stage multiplexer/demultiplexer operation is performed jointly by two different multiplexer/demultiplexer stages to uniquely address each of M nanowire signal lines with high probability. The first multiplexer/demultiplexer stage employs deterministic interconnections between nanowire signal lines and a first set of address lines and the second stage multiplexer/demultiplexer employs random interconnections between the nanowire signal lines and a second set of microscale or sub-microscale address lines. A larger number of address lines are needed in the second-stage for a high probability of unique addressability than would be needed if non-random interconnections were employed. The first stage, with deterministic interconnections, decreases the number of supplemental address lines needed by the factored nanoscale multiplexer/demultiplexer, because the first multiplexer/demultiplexer stage needs no supplemental address lines, and the number of supplemental address lines needed in the second multiplexer/demultiplexer stage is a function of only a subset of the total number of nanowire signal lines, rather than the total number of nanowire signal lines. The first multiplexer/demultiplexer stage divides M signal lines into N groups, so that the number of signal lines that the second multiplexer/demultiplexer stage selects from is reduced from M signal lines to M/N signal lines.

The present invention is described below in the following three subsections: (1) an overview of nanowire crossbars; (2) an overview of multiplexers/demultiplexers and nanoscale multiplexer/demultiplexer circuits; and (3) factored-nanoscale-multiplexer/demultiplexer-circuit embodiments of the present invention.

Overview of Nanowire Crossbars

Figure 1:
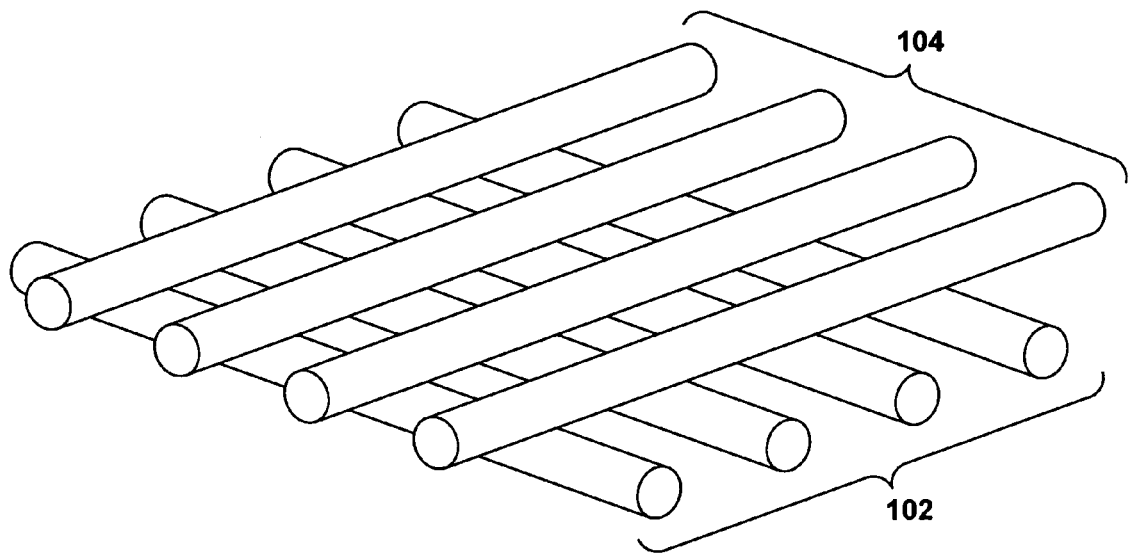
FIG. 1 illustrates an exemplary nanowire crossbar.

A relatively new and promising technology for manufacturing electronic devices involves nanowire crossbars. FIG. 1 illustrates an exemplary nanowire crossbar. In FIG. 1, a first layer of approximately parallel nanowires 102 is overlain by a second layer of approximately parallel nanowires 104 roughly perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102 at intersections that each represents the closest contact between two nanowires. Note that the term "nanowire crossbar" may refer to crossbars having one or more layers of sub-microscale, microscale, or larger wires in addition to nanowires.

Nanowires can be fabricated using mechanical nanoprinting techniques. Alternatively, nanowires can be chemically synthesized and can be deposited as layers of nanowires in one or a few process steps. Other alternative techniques for fabricating nanowires may also be employed. Thus, a two-layer nanowire crossbar comprising first and second layers, as shown in FIG. 1, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale signal-line leads or other electronic leads through a variety of different methods to incorporate the nanowires into electrical circuits.

Figure 2:
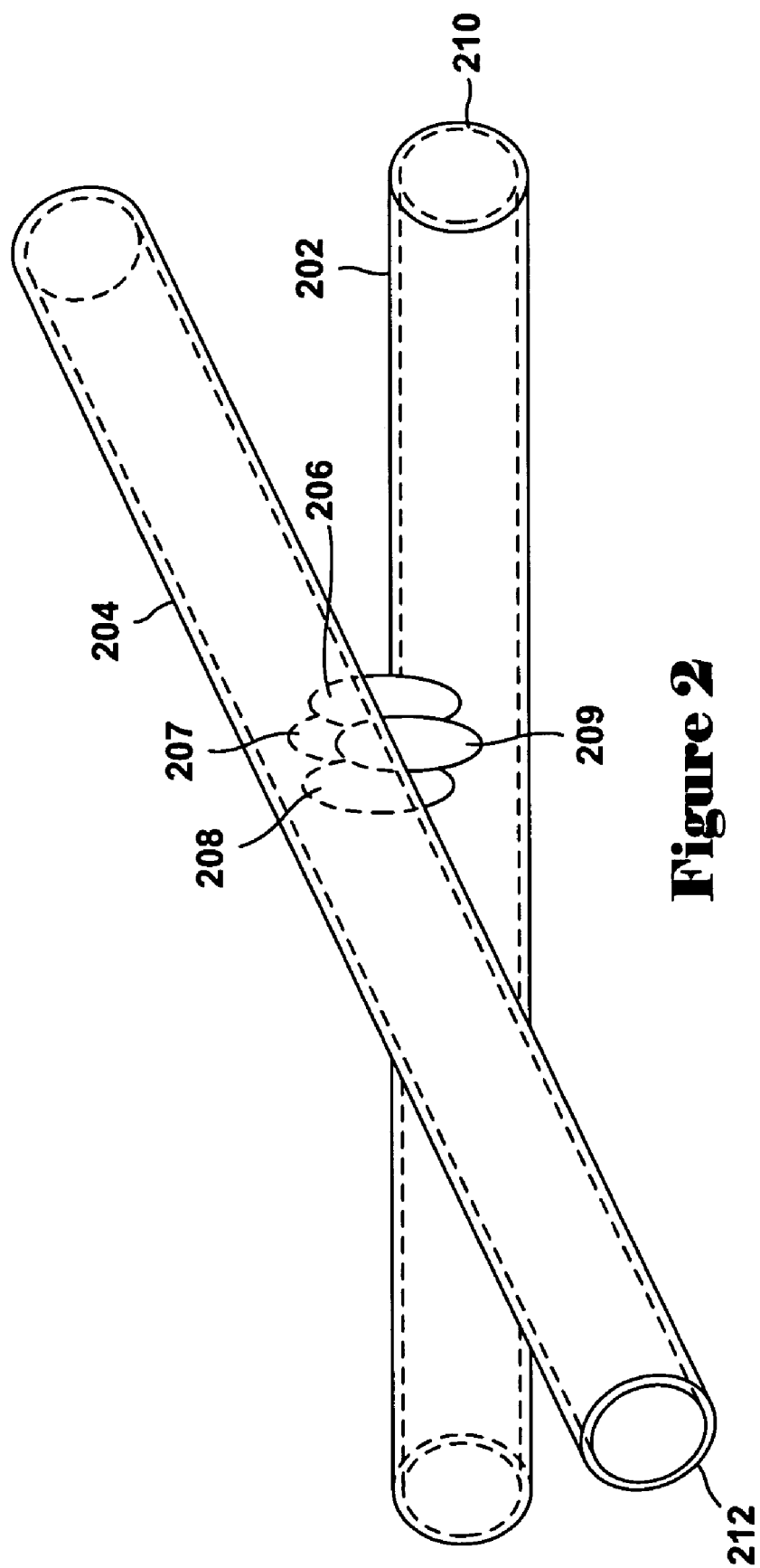
FIG. 2 illustrates a nanowire junction at an intersection between two roughly orthogonal nanowires.

Nanowire crossbars may be used to create arrays of nanoscale electronic components, such as transistors, diodes, resistors, and other familiar basic electronic components. FIG. 2 illustrates a nanowire junction at an intersection between two roughly orthogonal nanowires. In FIG. 2, the nanowire junction interconnects nanowires 202 and 204 of two contiguous layers within a nanowire crossbar. Note that the nanowire junction may or may not involve physical contact between the two nanowires 202 and 204. As shown in FIG. 2, the two nanowires are not in physical contact at their overlap point, but the gap between them is spanned by a small number of molecules 206-209. Various different types of molecules may be introduced at nanowire junctions for a variety of different purposes. In many cases, the molecules of a nanowire junction may be accessed, for various purposes, through different voltage levels or current levels placed on the nanowires forming the nanowire junction. The molecules spanning the nanowire junction in FIG.

2 may have various different quantum states in which the molecules exhibit resistive, semiconductor-like, or conductive electrical properties. The current passing between the two nanowires interconnected by a nanowire junction may be a nonlinear function of the voltage across the nanowire junction as a result of quantum-mechanical tunneling of electrons through relatively low-energy, unoccupied quantum states of the molecules. The quantum states, and relative energies of quantum states, of the molecules may be controlled by applying differential currents or voltages to the nanowires forming the interaction. For example, molecules may be conductive in a reduced state, but may act as insulators in an oxidized state, with redox reactions controlled by voltage levels determining which of the quantum states the molecules inhabit.

In general, a nanowire junction is anisotropic, having a polarity or direction with respect to physical properties, including electrical properties. This anisotropy may arise from different chemical and/or physical properties of nanowires in the two layers of a nanowire crossbar, may arise from asymmetries of nanowire-junction molecules, and uniform orientation of the nanowire-junction molecule with respect to the nanowire layers, and may arise both from differences in the properties of the nanowires as well as nanowire-junction-molecule asymmetries. The fact that nanowire junctions may have polarities allows for controlling nanowire junction properties by applying positive and negative voltages to nanowire junctions, eliciting forward and reverse currents within the nanowire junctions.

As shown in FIG. 2, the nanowires may include outer coatings, such as outer coatings 210 and 212. The outer coatings may serve to insulate nanowires from one another, may constitute the molecules that serve to span nanowire junctions when the nanowires are placed in contact with one another, and/or may serve as modulation-dopant-layers, which can be selectively activated to dope semiconductor nanowires. Both p-type and n-type modulation dopant coatings have been developed. In other applications, the molecules spanning nanowire junctions between overlapping nanowires may be introduced as a separate layer formed between layers of nanowires. In some cases, the state changes of nanowire-junction molecules may not be reversible. For example, the nanowire-junction molecules may initially be resistive, and may be made conductive through application of relatively high voltages. In other cases, the nanowire-junction molecules may be conductive, but the molecules may be irreversibly damaged, along with portions of the nanowires proximal to the nanowire junctions, through application of very high voltage levels, resulting in disrupting conductivity between the two nanowires and breaking electrical connection between them. In yet other cases, the nanowire-junction molecules may transition reversibly from one state to another and back, so that the nanoscale electrical components configured at nanowire junctions may be reconfigured, or programmed, by application of differential voltages to selected nanowire junctions.

One type of nanowire junction that can be configured behaves as if it were a resistor in series with a switch that may be opened or closed. When the switch is closed, the nanowire-junction molecule connects the overlapping nanowires at the nanowire junction. When the switch is open, the nanowire junction molecule spanning the nanowire junction has no effect on the current.

Figure 3A:
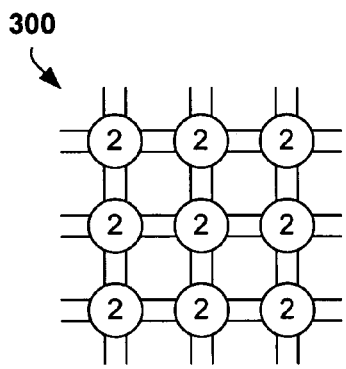
FIGS. 3A-3D illustrate one possible approach for configuring a network of nanoscale electronic components from a two-layer nanowire crossbar.
Figure 3B:
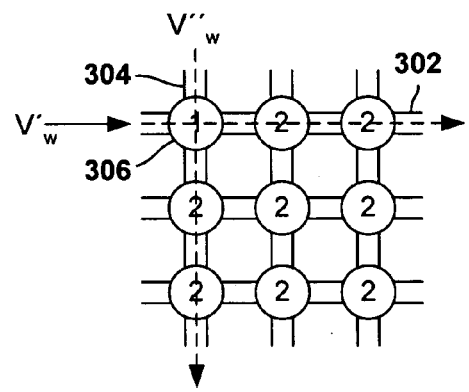
Figure 3C:
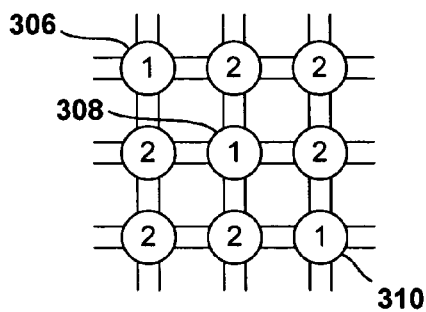
Figure 3D:
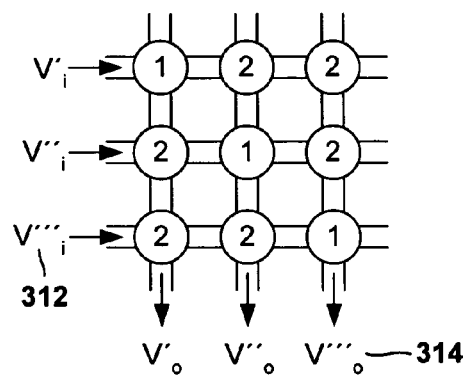

Nanowire junctions can be configured electrically, optically, mechanically or by other means. FIG. 3 illustrates one possible approach to configuring a network of reconfigurable nanoscale electrical components from a two-layer nanowire crossbar. In FIGS. 3A-3D, a small 3×3 nanowire crossbar is shown, with circles at all nine nanowire junctions that indicate the state of the nanowire-junction molecules. In one state, labeled "1" in FIGS. 3A-3D, the nanowire-junction molecules may have certain semiconductor, or conductive properties, while in a second state, labeled "2" in FIGS. 3A-3D, nanowire-junction molecules may have different properties. Initially, as shown in FIG. 3A, the states of the nanowire junctions of the nanowire crossbar 300 are in the state labeled "2." Next, as shown in FIG. 3B, each nanowire junction may be uniquely accessed by applying a WRITE voltage, or configuring voltage, to the nanowires that form the nanowire junction in order to configure, or program, the nanowire junction to have the state "1." For example, in FIG. 3B, a first WRITE voltage $v_w'$ is applied to horizontal nanowire 302 and a second WRITE voltage $v_w''$ is applied to vertical nanowire 304 to change the state of the nanowire junction 306 from "2" to "1." Individual nanowire junctions may be configured through steps similar to the steps shown in FIG. 3B, resulting finally in a fully configured nanoscale component network as shown in FIG. 3C. Note that, in FIG. 3C, the states of nanowire junctions 306, 308, and 310, forming a downward-slanted diagonal through the nanowire crossbar, have been configured by selective application of WRITE voltages. Finally, as shown in FIG. 3D, the nanoscale electrical component network can be used as a portion of an integrated circuit. Input voltages $v_i'$, $v_i''$, and $v_i'''$ may be applied to the nanoscale electrical component lattice at inputs 312 and output voltages $v_o'$, $v_o''$, and $v_o'''$ 314 may be accessed as the result of operation of the nanoscale electrical component network that represents a portion of an integrated circuit. In general, the input and output voltages $v_i'$, $v_i''$, and $v_i'''$ and $v_o'$, $v_o''$, and $v_o'''$ have relatively low magnitudes compared with the WRITE voltages $v_w$. Depending on the types of nanowires, types of dopants employed in the case of semiconductor nanowires, and the types of nanowire-junction molecules employed in the nanowire crossbar, many different, but similar configuring processes may be used to configure nanowire crossbars into nanowire-based electrical components networks. The example of FIG. 3 is meant to illustrate a general process by which nanowire crossbars may be configured as useful portions of electronic circuits.

Figure 4A:
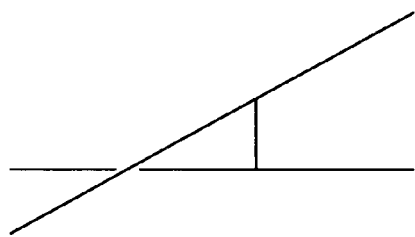
FIGS. 4A-4F schematically illustrate a number of simple electronic components that can be programmed using configurable nanowire junctions within a nanowire crossbar.
Figure 4B:
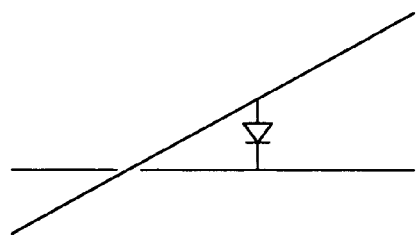
Figure 4C:
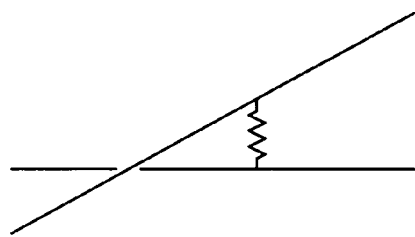
Figure 4D:
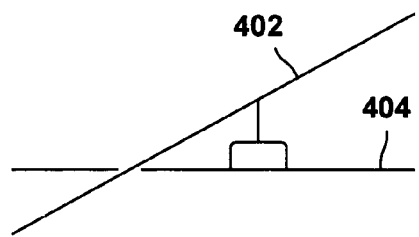
Figure 4E:
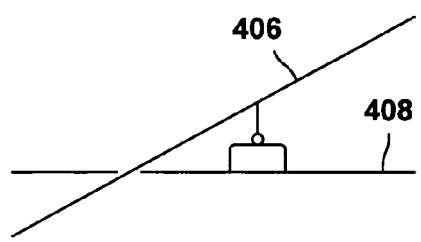
Figure 4F:
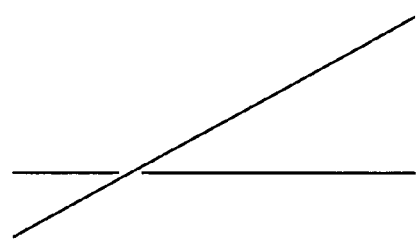

Nanowire junctions in nanowire crossbars may be configured, in various techniques depending on the chemical nature of the nanowires and nanowire-junction-spanning molecules, to form a wide variety of different, simple electronic components. FIG. 4 schematically illustrates a number of simple electrical components that can be programmed using configurable nanowire junctions with a nanowire crossbar. A nanowire junction may operate as (1) a simple conductive interconnection between two nanowires, as shown in FIG. 4A; (2) a diode that conducts current in only one direction between two nanowires, as shown in FIG. 4B; (3) a resistor, with the magnitude of resistance configurable by application of different configuring voltages, as shown in FIG. 4C; (4) a negatively doped field-effect transistor ("nFET"), as shown in FIG. 4D; (5) a positively doped field-effect transistor ("pFET"), as shown in FIG. 4E; and (6) the overlapping of two conductive nanowires, with the voltage and current associated with each nanowire completely independent from one another, as shown in FIG. 4F.

The nFET and pFET nanowire junctions perform switch operations, controlled by the signal level placed on gate wires, that can either enable or disable source/drain wires. An enabled source/drain wire allows current to flow beyond the nFET or pFET nanowire junction, while current does not flow beyond the nFET or pFET nanowire junction when the source/drain wire is disabled. However, nFETs and pFETs exhibit opposite behavior based on the signal level applied to the gate wires. In the case of the nFET, shown in FIG. 4D, a relatively low signal on the gate nanowire 402 causes the nFET to disable source/drain nanowire 404, while a relatively high signal on gate nanowire 402 causes the nFET to enable source/drain nanowire 404. By contrast, in the case of the pFET shown in FIG. 4E, a relatively low signal on gate nanowire 406 causes the pFET to enable source/drain nanowire 408, and a relatively high signal on gate nanowire 406 causes the pFET to disable source/drain nanowire 408. Note that a nanowire junction may also be configured as an insulator, essentially interrupting conduction at the nanowire junction with respect to both overlapping nanowires.

Thus, as discussed above with reference to FIGS. 1-4, a two-dimensional nanowire crossbar may be fabricated and then configured as a network of electrical components. Note also that a nanowire junction, although shown in FIGS. 4A-4F to comprise the nanowire junction of two single nanowires, may also comprise a number of nanowire junctions between a number of nanowires in a first layer of a nanowire crossbar that together comprise a single conductive element and the nanowires in a second nanowire layer that together comprise a second conductive element.

The configurable electrical resistances of nanowire junctions are important and special properties of certain types of nanowire junctions. When certain types of molecules are used for nanowire junctions, the initially relatively high resistances of the nanowire junctions may be lowered by applying relatively large positive voltages to the nanowire junctions. The resistances of the nanowire junctions may be a function of the magnitudes of the highest voltages applied to the nanowire junction. By applying higher and higher positive voltages to a nanowire junction, the resistance of the nanowire junction may be made lower and lower. A relatively low resistivity state achieved by application of a positive voltage may be reversed by applying a sufficiently high, negative voltage. Thus, not only is the electrical resistance of a nanowire junction configurable, the electrical resistance may also be reconfigurable, depending on the type of molecules forming the nanowire junction.

Note that the term "signal" refers to a detectable low or high physical quantity, such as voltage and current, that can be input, output, and transmitted through nanowire crossbars. The terms "low" and "high" generally refer to ranges of values. For example, a signal that ranges between no signal and a signal threshold may be called a "low signal," and any signal above the signal threshold is called a "high signal." A low signal is represented by the bit value "0," and a high signal is represented by the bit value "1."

Overview of Multiplexers/Demultiplexers and Nanoscale Multiplexer/Demultiplexer Circuits One type of signal multiplexer selectively outputs a signal input from one of a number of input signal lines. The input signal line is selected by an address input to the multiplexer via a number of separate input address lines. FIGS. 5A-5B illustrate two exemplary 4-input-line-to-1-output-line, or 4-to-1, multiplexers. As shown in FIG. 5A, 4-to-1 multiplexer 501 receives four different signals via input signal lines "$in_1$," "$in_2$," "$in_3$," and "$in_4$" 502-505. At each instant in time, a signal line may be in a high-voltage state, or ON, or in a low-voltage state, or OFF. In general, an ON state is designated as "1," while an OFF state is designated as "0."

The 4-to-1 multiplexer shown in FIG. 5A outputs a single output signal line 506, labeled "out." The 4-to-1 multiplexer receives addresses input via four input address lines "$a_1$," "$\bar{a}_1$," "$a_2$," and "$\bar{a}_2$" 508-511 which correspond to two address bits "$a_1$" and "$a_2$" and their respective compliments, "$\bar{a}_1$" and "$\bar{a}_2$." Alternately, as shown in FIG. 5B, addresses may be input to the 4-to-1 multiplexer 501 via only two address lines, "$a_1$," and "$a_2$."

FIG. 5C shows a truth table indicating how values input via the two address inputs "$a_1$" and "$a_2$" determine the state of the output signal line of the 4-to-1 multiplexer shown in FIGS. 5A-5B. The two address inputs "$a_1$" and "$a_2$" carry a 2-bit, 4-value address at each instant in time. The 2-bit address selects one of the four input lines "$in_1$," "$in_2$," "$in_3$," and "$in_4$." As shown in FIG. 5C, input address value "00" selects output of the signal input on input signal line "$in_1$." Similarly, the addresses "01," "10," and "11" select output of the signal input on input signal lines "$in_2$," "$in_3$," and "$in_4$," respectively.

FIGS. 6A-6B illustrate two exemplary 1-to-4 demultiplexers. Demultiplexers operate in a manner opposite from multiplexers, with a single input line output to a selected one of four output signal lines at each instant in time. The output signal line to which the input signal is directed is selected by an address input via a number of input address lines. FIG. 6C shows a truth table indicating how the values of the two address inputs, "$a_1$" and "$a_2$," determine the output signal line to which the input signal is directed by the 1-to-4 demultiplexer shown in FIGS. 6A-6B.

Figure 7A:
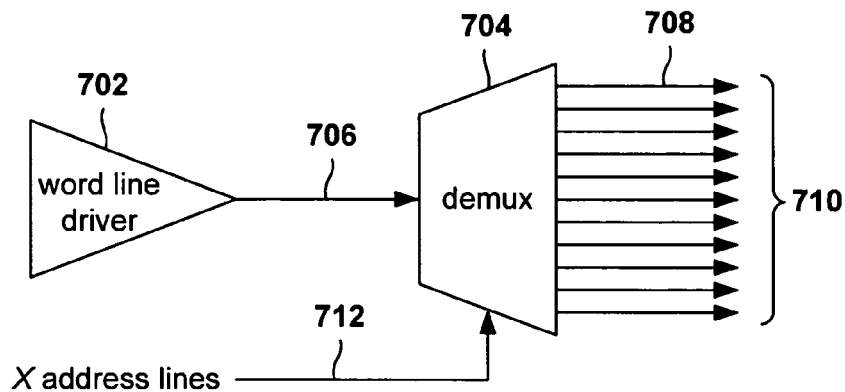
FIG. 7A illustrates a logic-circuit representation of an exemplary demultiplexer circuit.

FIG. 7A illustrates a logic-circuit representation of an exemplary demultiplexer circuit. An input signal, input to the demultiplexer, is output to one of many output signal lines. In FIG. 7A, input signal driver 702 transmits a signal to demultiplexer 704 via input signal line 706. Demultiplexer 704 outputs the signal to an output signal line, such as output signal line 708, selected from the output-signal-line group 710 comprising a number M of output signal lines. Output signal line 708 may be selected from output-signal-line group 710 by an address input via a number of address lines 712. For unique addressing of M output signal lines, either $\log_2 M$ or $(\log_2 M)+1$ address lines are needed, depending on whether or not M is an exact power of 2, assuming digital addresses.

Figure 7B:
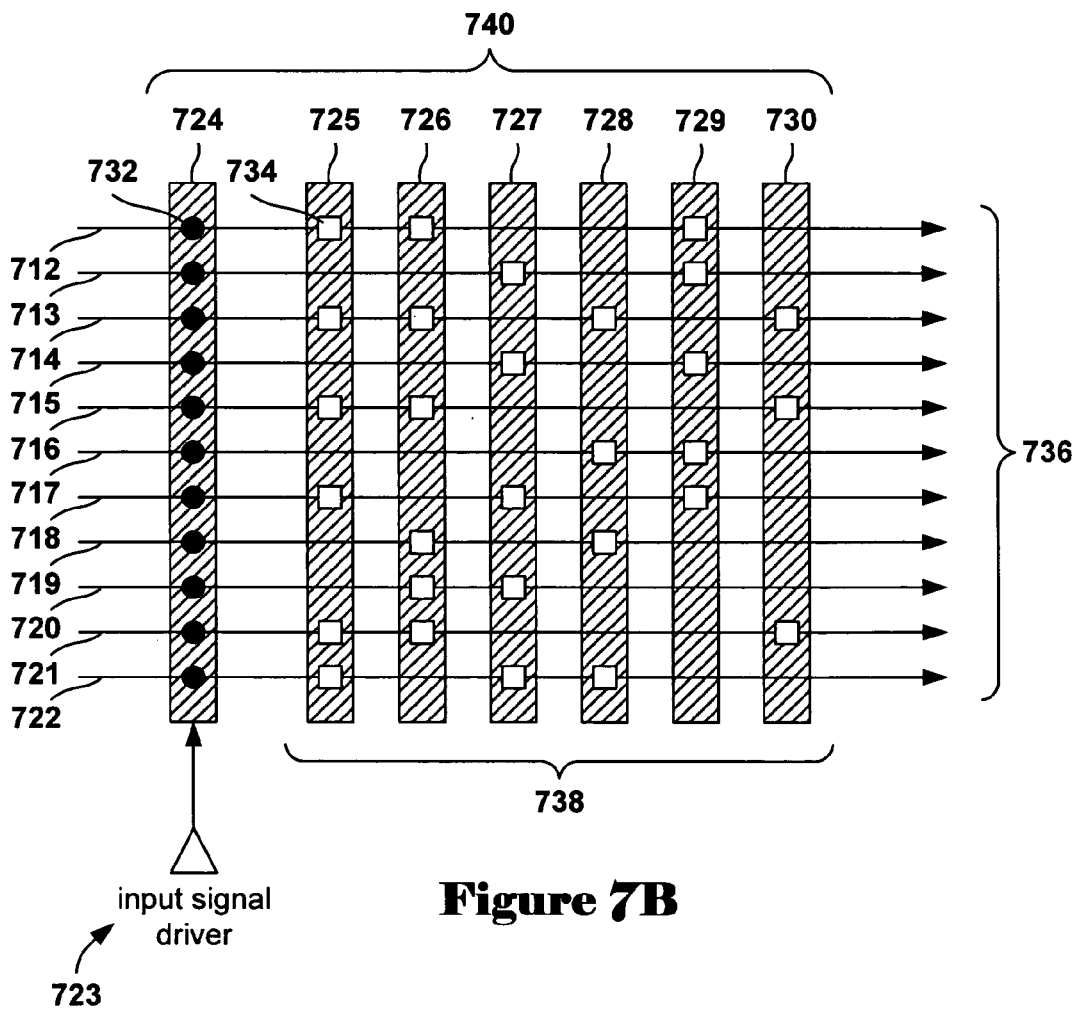
FIG. 7B illustrates an exemplary nanoscale demultiplexer circuit.

FIG. 7B illustrates an exemplary hybrid nanoscale/microscale nanowire-crossbar demultiplexer circuit. Nanowire output signal lines 712-722 are shown as horizontal lines. Input signal driver 723 transmits a signal to a microscale or sub-microscale input signal line 724, shown as a vertical cross-hatched rectangle that crosses each output signal line 712-722 and passes the input signal to each output signal line 712-722. Each output signal line 712-722 crosses six microscale or sub-microscale address lines 725-730 that are shown as vertical cross-hatched rectangles. Output signal lines 712-722 are in a first plane and input signal line 724 and address lines 725-730 are in a second plane that is parallel to the first plane. A feature in the first plane can electronically interconnect to a different feature in the second plane only through a nanowire junction.

Two types of nanowire junctions are employed in the exemplary nanoscale demultiplexer circuit of FIG. 7B: (1) conductive-interconnection nanowire junctions, such as conductive-interconnection nanowire junction 732, shown as filled circles; and (2) switch nanowire junctions, or switches, such as switch 734, shown as unfilled rectangles. FIG. 7B shows each output signal line 712-722 forming a conductive-interconnection nanowire junction at each intersection with input signal line 724, and each output signal line 712-722 forming a switch at approximately half of the intersections with address lines 725-730.

Switches operate by application of selected voltages to a gate wire, which either enables or disables signal transmission through the switch on a source/drain wire. In the present invention, address lines serve as gate wires and output signal lines serve as source/drain wires. A high voltage, HI, applied to an address line enables transmission of signals through any switches interconnecting the address line with output signal lines. A low voltage, LO, applied to an address line disables transmission of signals through any switches interconnecting the address line with output signal lines.

Placement of switches along address lines determines the addressing function of a demultiplexer circuit. The switches in FIG. 7B are implemented by a random switch-positioning method. The method involves a random chemical-deposition process that forms switches at intersections between output signal lines and address lines with a probability of ~0.5 for switch formation at any given intersection. The chemical-deposition process either results in a fully-formed nanowire junction, or no nanowire junction, at each intersection. No conditional or partial nanowire junctions are assumed to be created by this process.

Each output signal line can be selectively addressed by application of particular combinations of HI and LO voltages to the address lines to create unique words, each bit of which is represented by the signal on an address line. Each output signal line has a word address determined by the specific switch placement on the output signal line. When a specific combination of voltages, or address, is applied to the address lines, the output signal lines having switch configurations corresponding to the address are selected. It is desirable for each output signal line to be uniquely addressable, so that each output signal line can be uniquely selected.

As shown in FIG. 7B, input signal driver 723 transmits an input signal to input signal line 724. The input signal passes through conductive-interconnection nanowire junctions to output signal lines 712-722. When voltage HI is applied to each address line connected to an output signal line by a switch, the output signal line is selected, and outputs the signal input by the input signal driver 723. The selected output signal line is provided with a low-impedance path from input signal driver 723 through each interconnecting switch. In order to prevent multiple output signal line selection, a voltage LO is applied to those address lines not interconnected with the addressed signal line through a switch.

If enough address lines are included in a nanoscale multiplexer/demultiplexer circuit constructed by the above described random-deposition method, then there is a high probability that each output signal line has a unique word address. Studies have shown that there is a high probability of unique addressability when the number of address lines is $k \log_2 M$, where k is a value that represents an increase in the number of address lines needed for nanoscale multiplexer/demultiplexer circuits using randomly fabricated nanowire junction interconnections over the number of address lines needed for nanoscale multiplexer/demultiplexer circuits using deterministically fabricated nanowire junction interconnections. The value of k is typically between 2 and 5. The total number of microscale or sub-microscale lines (740 in FIG. 7B) in the nanoscale multiplexer/demultiplexer circuit is equal to the number of address lines (738 in FIG. 7B) plus the input signal line (724 in FIG. 7B). Thus, the total number of microscale or sub-microscale lines needed for a high probability of uniquely addressing is $(k \log_2 M)+1$.

Figure 7C:
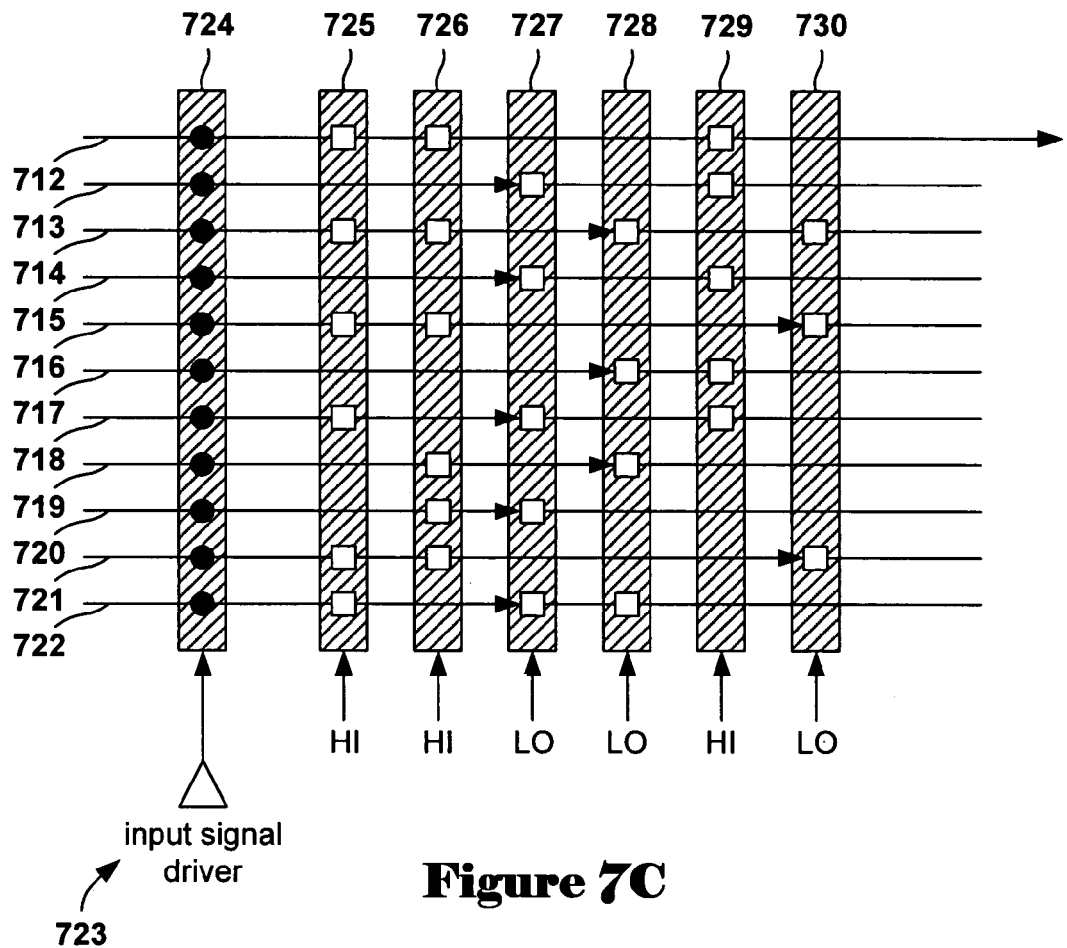
FIG. 7C illustrates a hypothetical addressing operation performed by the exemplary nanoscale demultiplexer circuit of FIG. 7B.

An addressing protocol can be performed to determine the specific addresses for each output signal line in a nanoscale multiplexer/demultiplexer circuit using randomly fabricated nanowire junction interconnections. Once it is determined which address lines interconnect with a particular output signal line, the output signal line can be addressed, by supplying a HI voltage to each address line interconnected to the output signal line and supplying a LO voltage to each address line not interconnected with the output signal line. FIG. 7C illustrates a hypothetical addressing operation performed by the exemplary nanoscale demultiplexer circuit of FIG. 7B. Input signal driver 723 transmits an input signal to input signal line 724. Conductive-interconnection nanowire junctions pass the input signal to output signal lines 712-722. If, for example, it is desired to address output signal line 712, then voltage HI is applied to every address line connected to output signal line 712. Thus, voltage HI is applied to address lines 725, 726, and 729. Voltage LO is applied to address lines 727, 728, and 730, which are not connected to output signal line 712. As shown in FIG. 7C, transmission of the signal in addressed output signal line 712 continues beyond each interconnecting switch, while transmission of the signal in the remaining output signal lines is disabled by one or more switches interconnected to a voltage-LO-supplied address line. FIG. 7C shows arrowheads superimposed on nanowire junctions representing signals disabled in output signal lines at the nanowire junctions. The output signal in addressed output signal line 712 passes through switches 725, 726, and 729.

Figure 8:
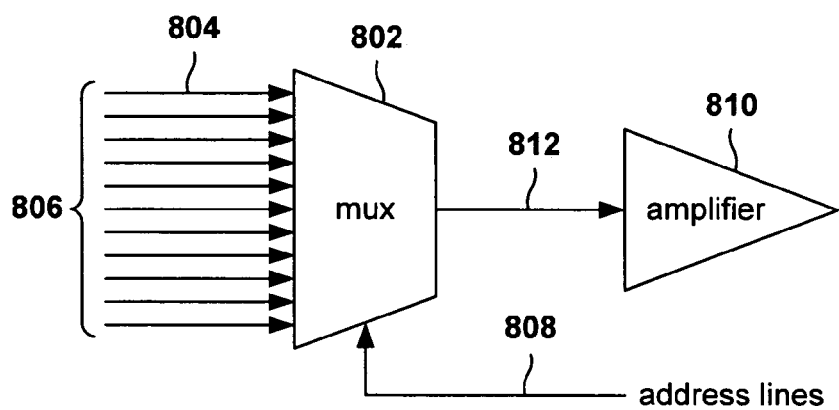
FIG. 8 illustrates a logic-circuit representation of an exemplary multiplexer circuit.

The exemplary nanoscale multiplexer/demultiplexer circuit shown in FIGS. 7B-7C is described in terms of a nanoscale demultiplexer circuit. The nanoscale multiplexer/demultiplexer circuit can also operate in reverse, as a nanoscale multiplexer circuit. FIG. 8 illustrates a logic-circuit representation of an exemplary nanoscale multiplexer circuit. Nanoscale multiplexer circuit 802 inputs a signal from a selected input signal line, such as input signal line 804, selected from the input-signal-line group 806 of M input signal lines. Input signal line 804 is selected from input-signal-line group 806 by an address input via a number of address lines 808. To uniquely address each of M input signal lines, $k \log_2 M$ address lines are needed for a high probability of unique addressability. The signal input to multiplexer 802 is output to amplifier 810, via output signal line 812.

The nanoscale multiplexer/demultiplexer circuit, described with reference to FIGS. 7A-8, has unfavorable characteristics at small and large values of M. When M is of relatively small magnitude, a relatively large number of address lines are needed compared to the number of nanowire signal lines addressed. When M is of a relatively large magnitude, a signal in an addressed signal line passes through approximately $k \log_2 M$ signal-line/address-line intersections. If approximately half of the signal-line/address-line intersections contain a switch, then the signal encounters approximately $(k/2) \log_2 M$ switches. Variable switch characteristics due to chemical and physical fabrication processes can cause voltage signals transmitted through large numbers of switches in addressed signal lines to fall to an intermediate voltage level between the maximum LO voltage and minimum HI voltage. In the range between "1" and "0," binary values cannot be distinguished from one another.

Factored-Nanoscale-Multiplexer/Demultiplexer-Circuit Embodiments of the Present Invention In various embodiments of the present invention, a factored nanoscale multiplexer/demultiplexer circuit is described that has a high probability of uniquely addressing each of M signal lines by implementing a multiplexing/demultiplexing operation that is performed in two stages: (1) a first stage 1-to-N multiplexer/demultiplexer, and (2) a second stage 1-to-(M/N) nanoscale multiplexer/demultiplexer. The first stage 1-to-N multiplexer/demultiplexer interconnects an input signal line with N internal signal lines. Each internal signal line is received by one of N input signal pads within a nanowire crossbar. Each input signal pad interconnects one internal signal line to one of N second stage groups of M/N output signal lines. Thus, the factored nanoscale multiplexer/demultiplexer circuit is organized as a hierarchical tree, with N internal signal lines fanning out from a root node comprising the first stage 1-to-N multiplexer/demultiplexer, to N signal pad intermediate nodes. M/N output signal lines fan out from each intermediate node.

The interconnections within the second stage 1-to-(M/N) nanoscale multiplexer/demultiplexer are randomly fabricated. In general, supplemental address lines are needed to uniquely address each output signal line within a randomly fabricated nanoscale multiplexer/demultiplexer circuit. By using a first stage 1-to-N multiplexer/demultiplexer with deterministically fabricated address line interconnections, the number of supplemental address lines that are needed in the second stage 1-to-(M/N) nanoscale multiplexer/demultiplexer is reduced.

The factored nanoscale multiplexer/demultiplexer circuit of the current embodiment is defect tolerant. The factored nanoscale multiplexer/demultiplexer circuit divides signal lines into discrete groupings. Signal lines that do not form nanowire junctions with any address lines or input signal pads can be ignored without disrupting functioning of the entire factored nanoscale multiplexer/demultiplexer circuit. Similarly, placement of signal lines into discrete groupings lessens the potential adverse affects of manufacturing errors, such as misregistrations of input signal pads, caused by, for example, vibrations or misalignments. Misregistrations generally cause only signal lines corresponding to a misregistered input signal pad to be non-addressable. If two or more signal lines share the same address and, as a result, are addressed together, the pair of signal lines can be either ignored, or only one of the two signal lines used.

Figure 9:
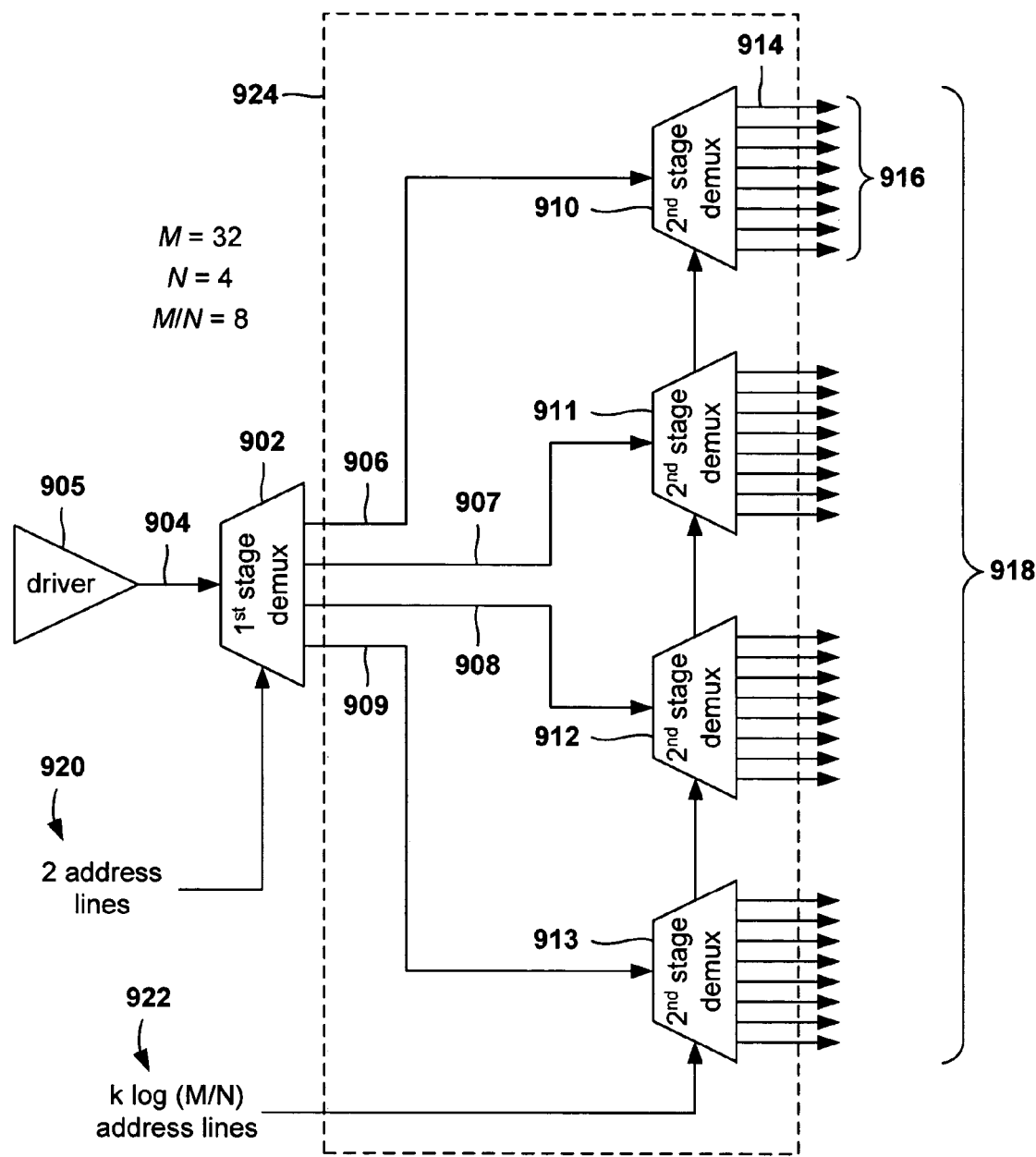
FIG. 9 illustrates an exemplary factored nanoscale demultiplexer circuit representing one embodiment of the present invention.

In one embodiment of the present invention, a factored nanoscale demultiplexer circuit is described that uniquely addresses each of M output signal lines by implementing a demultiplexing operation that is performed jointly by two demultiplexer stages. FIG. 9 illustrates an exemplary factored nanoscale demultiplexer circuit representing one embodiment of the present invention. First stage 1-to-N demultiplexer 902 receives signals on external input signal line 904 from input signal driver 905 and outputs N internal nanowire signal lines 906-909. Each internal signal line 906-909 is input to one of N second stage nanoscale 1-to-(M/N) demultiplexers 910-913. Each second stage nanoscale 1-to-(M/N) demultiplexer 910-913 is connected to a distinct external-output-signal-line group, such as external-output-signal-line group 916, which includes M/N external output signal lines, such as external output signal line 914. The total number of external output signal lines 918, or M, is equal to the number of second stage nanoscale 1-to-(M/N) demultiplexers, N, multiplied by the number of external output signal lines within each second stage nanoscale 1-to-(M/N) demultiplexer, M/N. For the circuit shown in FIG. 9, M is 32, N is 4, and M/N is 8.

Input address lines, received by first stage 1-to-N demultiplexer 902 and second stage nanoscale 1-to-(M/N) demultiplexers 910-913, control which external output signal line is selected for a given addressing operation. In FIG. 9, first stage 1-to-N demultiplexer 902 receives two address lines 920, which select one of N internal signal lines, and second stage nanoscale 1-to-(M/N) demultiplexers 910-913 each receive k $\log_2$ M address lines 922, which select one of M/N external output signal lines. The nanowire crossbar portion of the factored nanoscale demultiplexer circuit is shown enclosed by dotted box 924.

Figure 10:
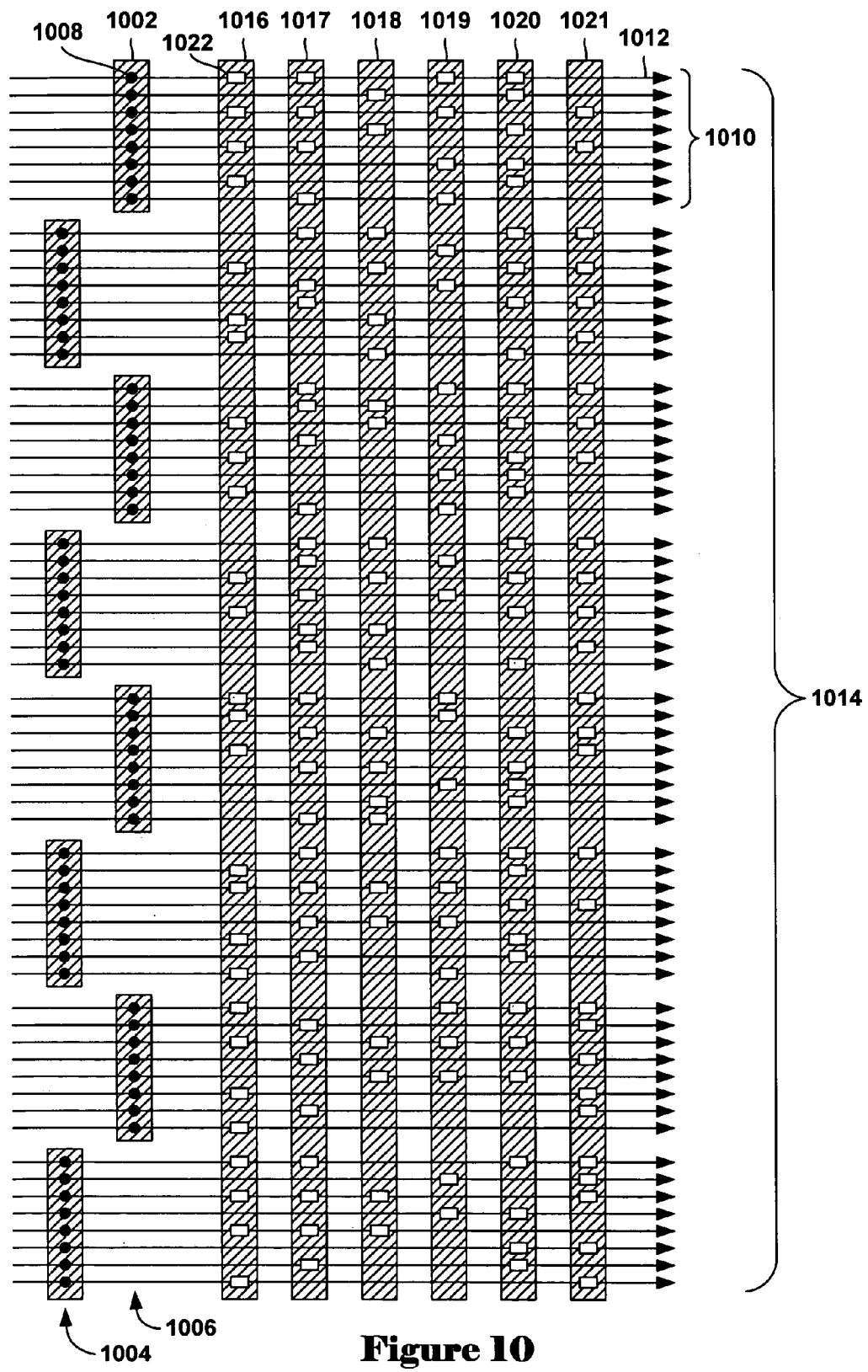
FIG. 10 illustrates a second stage nanoscale 1-to-(M/N) demultiplexer of a factored nanoscale demultiplexer circuit with eight input signal pads that represents one embodiment of the present invention.

FIG. 10 illustrates a second stage nanoscale 1-to-(M/N) demultiplexer of a factored nanoscale demultiplexer circuit with eight input signal pads that represents one embodiment of the present invention. Eight input signal pads, such as input signal pad 1002, are shown staggered into two columns 1004 and 1006 of four input signal pads each. Each input signal pad contains eight conductive-interconnection nanowire junctions, such as conductive-interconnection nanowire junction 1008, that interconnect each input signal pad with a distinct group of external output signal lines, such as external-output-signal-line group 1010. Each external-output-signal-line group comprises M/N external output signal lines, such as external output signal line 1012. Collectively, a number N groups of M/N external-output-signal-line groups make up the total number, M, of external output signal lines 1014. Each external output signal line intersects address lines 1016-1021. Nanowire-junction switches, such as nanowire-junction switch 1022, are randomly deposited at approximately half of the output-signal-line/address-line intersections.

Figure 11A:
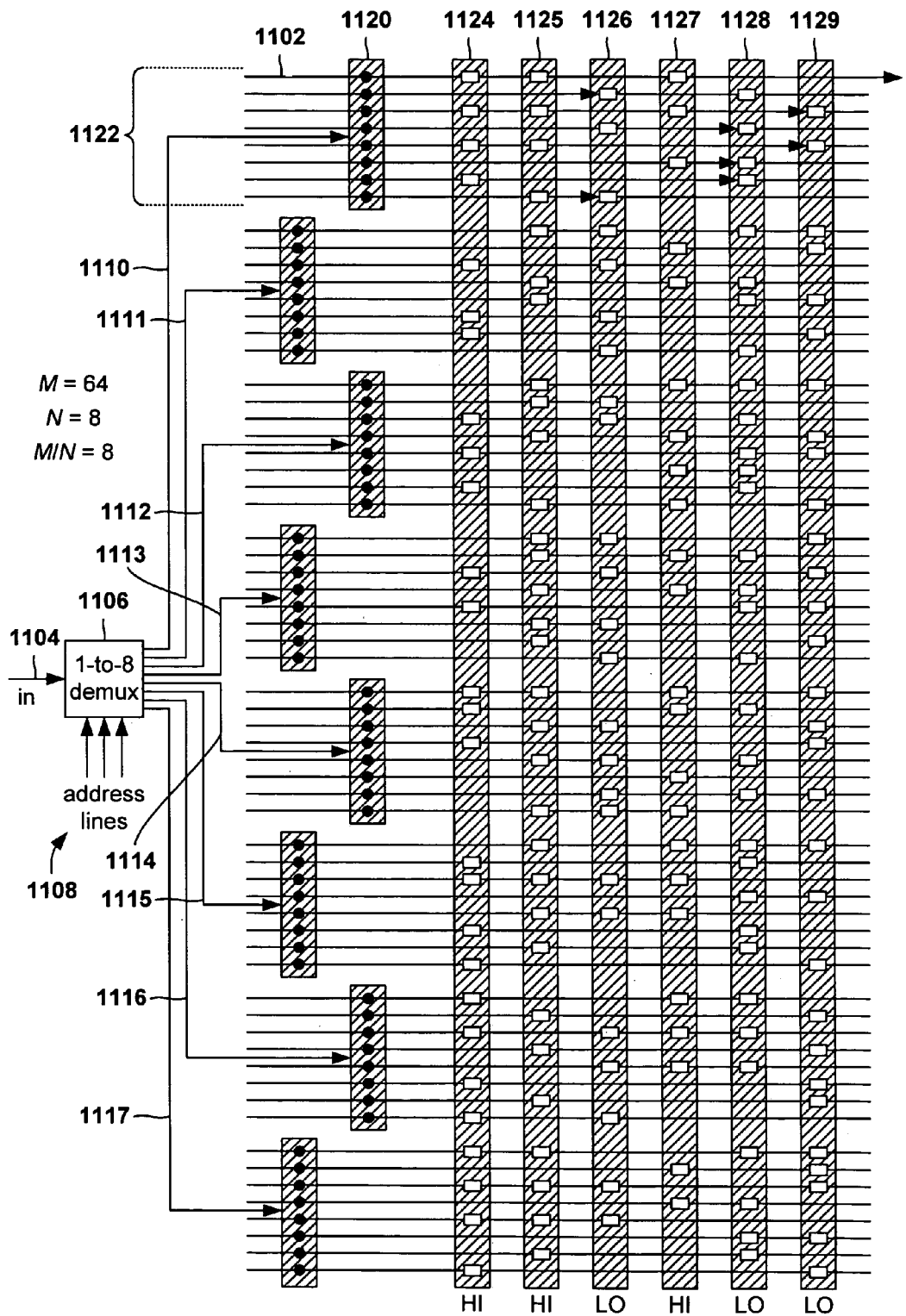
FIGS. 11A-11B illustrate two hypothetical addressing operations performed by a factored nanoscale demultiplexer circuit that represents one embodiment of the present invention.
Figure 11B:
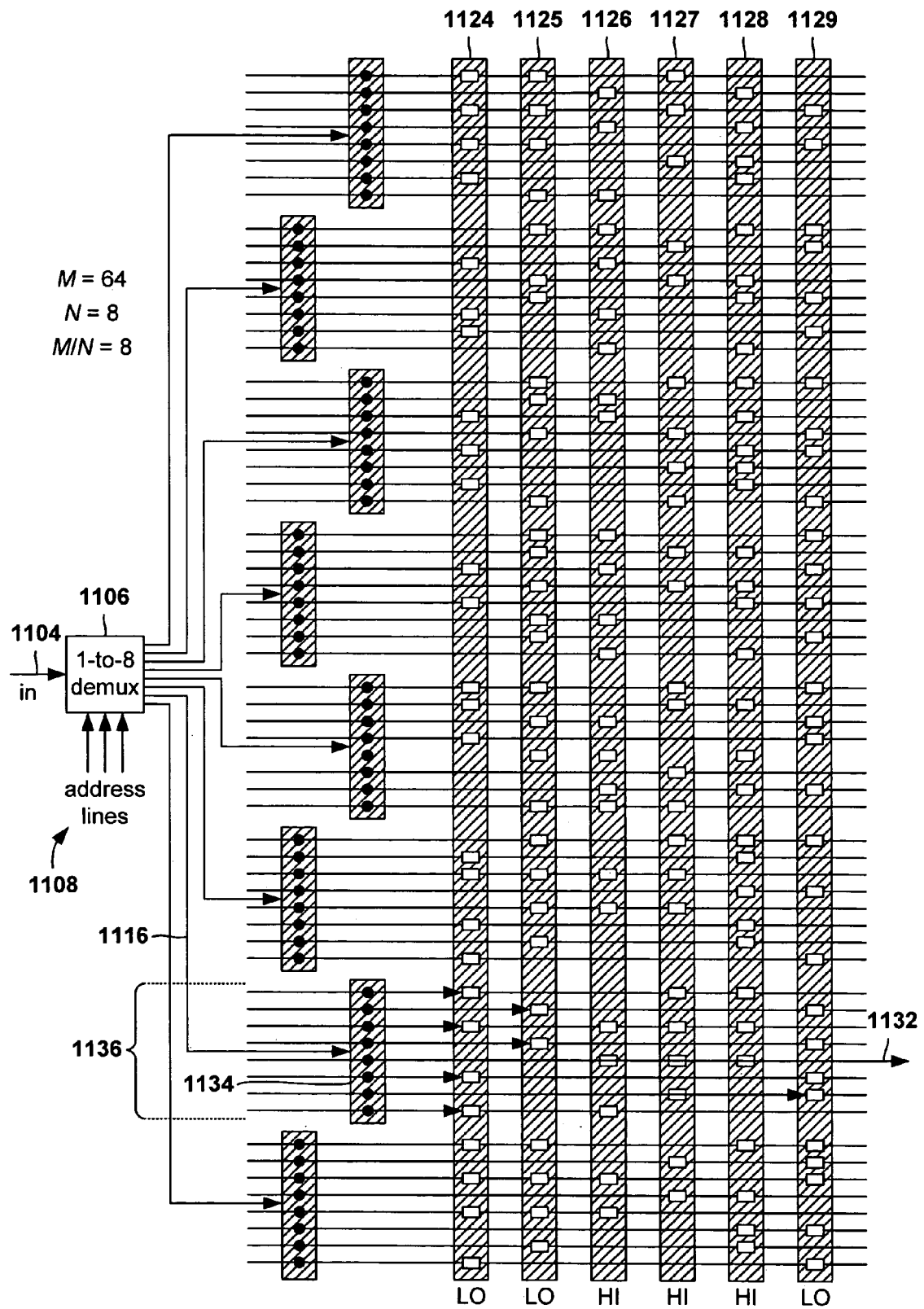

FIGS. 11A-11B illustrate two hypothetical addressing operations performed by a factored nanoscale demultiplexer circuit that represents one embodiment of the present invention. In FIGS. 11A-11B, M, the total number of external output signal lines, is 64; N, the number of input signal pads interconnected with first stage 1-to-N demultiplexer, is 8; and M/N is 8. In FIG. 11A, external output signal line 1102 is addressed by a first hypothetical addressing operation. An input signal transmitted via external input signal line 1104 is received by first stage 1-to-8 demultiplexer 1106. First stage 1-to-8 demultiplexer 1106 also receives three two-bit address lines 1108 that select to which of 8 internal signal lines 1110-1117 the input signal is output. In the example shown in FIG. 11A, internal signal line 1110 is selected. Conductive-interconnection nanowire junctions pass the input signal from input signal pad 1120 to each of M/N output signal lines in external-output-signal-line group 1122. External output signal lines not interconnected with input signal pad 1120 are placed into a high-impedance state by first stage 1-to-8 demultiplexer 1106. Each of the selected M/N external output signal lines interconnects through 0 or more nanowire junctions with address lines 1124-1129. Voltage HI is applied to each address line that interconnects with addressed external output signal line 1102 via a nanowire junction. Thus, voltage HI is applied to address lines 1124, 1125, and 1127. Voltage LO is applied to each address line that does not interconnect with addressed external output signal line 1102 through a nanowire switch. Thus, voltage LO is applied to address lines 1126, 1128, and 1129. Every external output signal line within external-output-signal-line group 1122 is disabled by a switch interconnected to a voltage-LO-supplied address line, as shown in FIG. 11 by arrowheads superimposed at signal disabling switches, except for addressed external output signal line 1102, which transmits beyond all of the switches.

A second hypothetical addressing-operation example is shown in FIG. 11B. In FIG. 11B, external output signal line 1132 is addressed. An input signal is output from a first stage 1-to-8 demultiplexer 1106, via internal signal line 1116, to input signal pad 1134. The input signal passes to each external output signal line within external-output-signal-line group 1136. Voltage HI is applied to address lines 1126, 1127, and 1128. Voltage LO is applied to address lines 1124, 1125, and 1129. The external output signal is disabled in each external output signal line within external-output-signal-line group 1136, except for addressed external output signal line 1132.

Figure 12:
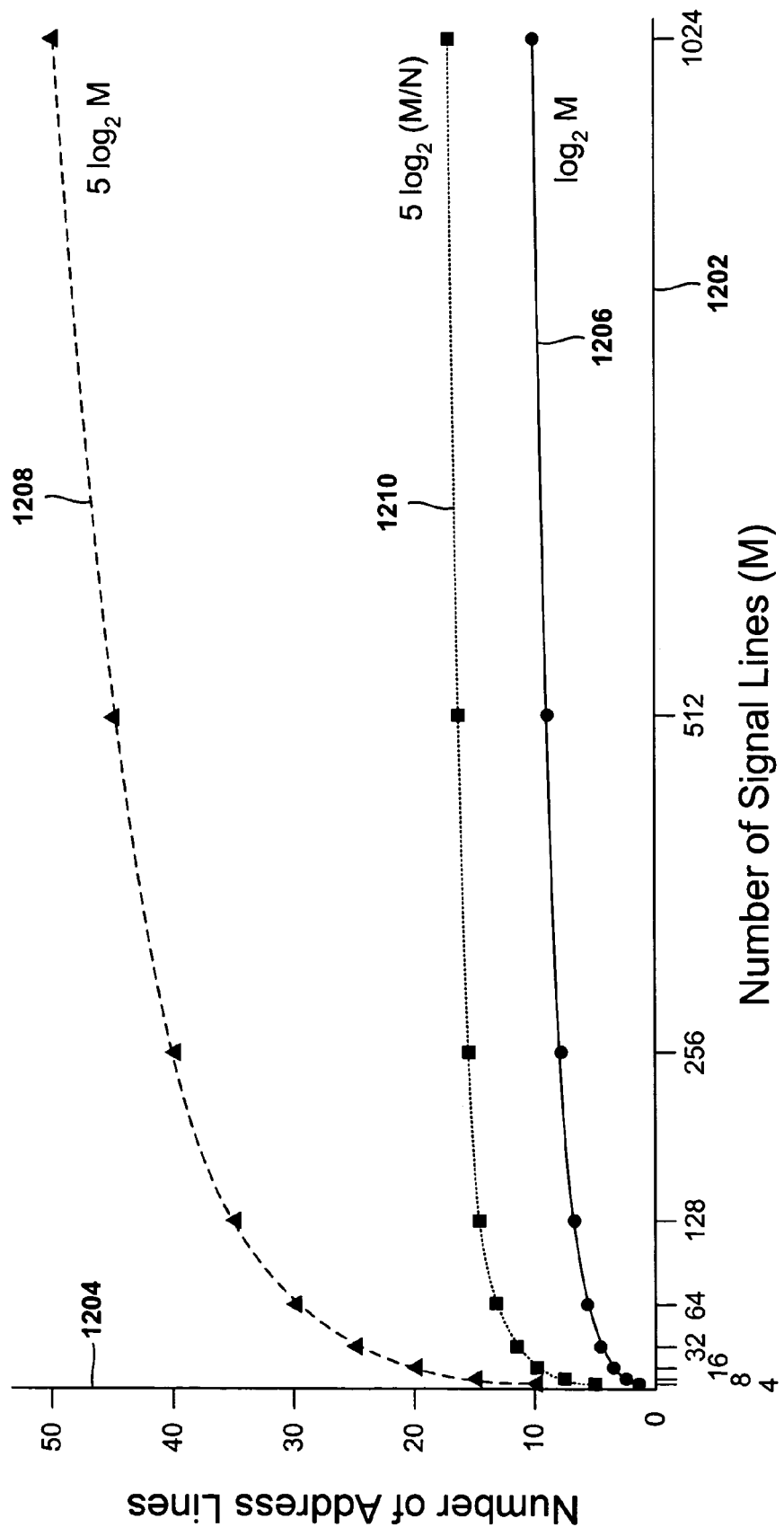
FIG. 12 shows a graph that compares the number of address lines needed for a high probability of uniquely addressing M signal lines in a nanoscale multiplexer/demultiplexer circuit for three different nanoscale multiplexer/demultiplexer-circuit designs.

FIG. 12 shows a graph that compares the number of address lines needed for a high probability of uniquely addressing M signal lines in a nanoscale multiplexer/demultiplexer circuit for three different nanoscale multiplexer/demultiplexer-circuit designs. The number of address lines needed for each nanoscale multiplexer/demultiplexer circuit design is shown with a different $\log_2$-based relationship. Horizontal axis 1202 represents varying numbers of signal lines employed by hypothetical nanoscale multiplexer/demultiplexer circuits. Note that the horizontal axis is incremented according to a logarithmic scale. Vertical axis 1204 represents the number of address lines employed by each nanoscale multiplexer/demultiplexer circuit, given the number of signal lines addressed. Curve 1206 is shown as a solid line with $\log_2$-values shown as filled circles. Curve 1206 represents the number of address lines needed for a high probability of uniquely addressing M signal lines for a nanoscale multiplexer/demultiplexer circuit that uses deterministic interconnections between the signal lines and the address lines. Accordingly, curve 1206 is plotted with the number of address lines determined as a function of $\log_2 M$. Curve 1208 is shown as a dashed line with $\log_2$-values shown as filled triangles. Curve 1208 represents the number of address lines needed for a high probability of uniquely addressing M signal lines for a nanoscale multiplexer/demultiplexer circuit that uses random interconnections between the signal lines and the address lines. Accordingly, curve 1208 is plotted with the number of address lines determined as a function of $k \log_2 M$, with k arbitrarily assigned a value of 5. Curve 1210 is shown as a dotted line with $\log_2$-values shown as filled squares. Curve 1210 represents the number of address lines needed for a high probability of uniquely addressing M signal lines for a factored nanoscale multiplexer/demultiplexer circuit representing one embodiment of the present invention. Curve 1210 is plotted with the number of address lines determined as a function of $k \log_2 (M/N)$, with k and N both arbitrarily assigned a value of 5. Note that the value used for N can be any natural number less than M, and can be varied depending on the design specifications of a given factored nanoscale multiplexer/demultiplexer circuit.

As shown in FIG. 12, the number of address lines needed by a factored nanoscale multiplexer/demultiplexer circuit is less than the number of address lines needed by an unfactored nanoscale multiplexer/demultiplexer circuit that uses random interconnections and greater than the number of address lines needed by an unfactored nanoscale multiplexer/demultiplexer circuit that uses deterministic interconnections between the signal lines and the address lines.

Figure 13:
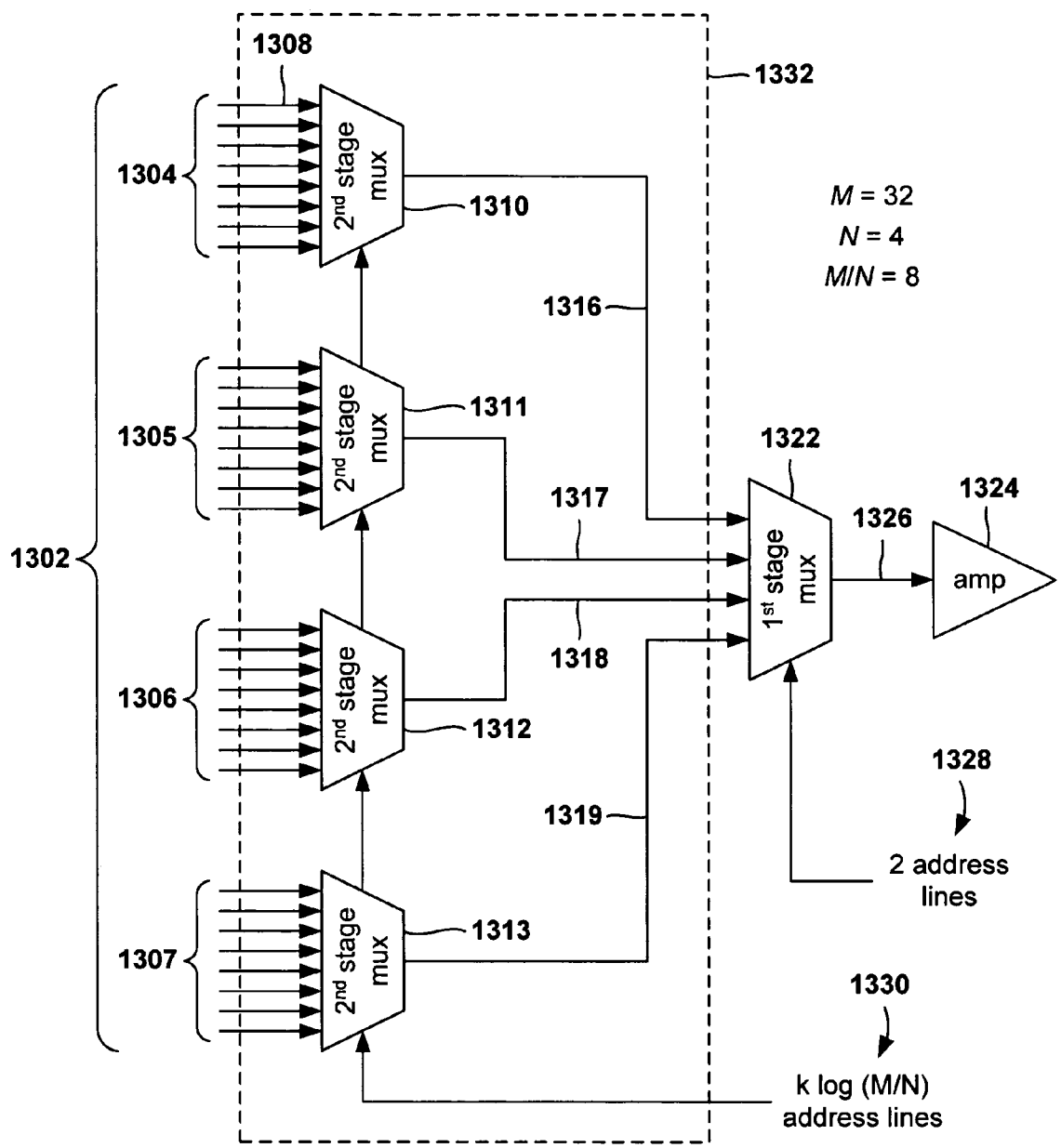
FIG. 13 illustrates an exemplary factored nanoscale multiplexer circuit representing one embodiment of the present invention.

The present invention has been described in terms of operating as a demultiplexer. However, the factored nanoscale multiplexer/demultiplexer circuit may also be used in reverse, as a factored nanoscale multiplexer circuit that selects one input signal from a number of input signals. FIG. 13 illustrates an exemplary factored nanoscale multiplexer circuit representing one embodiment of the present invention. In FIG. 13, the total number of external input signal lines 1302, or M, comprises N external-input-signal-line groups 1304-1307, with each input-signal-line group 1304-1307 comprising M/N external input signal lines, such as external input signal line 1308. Each external-input-signal-line group 1304-1307 is received by one of N second stage nanoscale (M/N)-to-1 multiplexers 1310-1313. Each second stage nanoscale (M/N)-to-1 multiplexer 1310-1313 outputs an internal signal line 1316-1319 that interconnects the second stage nanoscale (M/N)-to-1 multiplexer with a first stage N-to-1 multiplexer 1322. The first stage N-to-1 multiplexer 1322 interconnects with amplifier 1324, via external output signal line 1326. For the circuit shown in FIG. 13, M is 32, N is 4, and M/N is 8.

Input address lines, received by first stage N-to-1 multiplexer 1322 and second stage nanoscale (M/N)-to-1 demultiplexers 1310-1313, control which signal line is selected by a given addressing operation. In FIG. 13, first stage N-to-1 multiplexer 1322 receives address lines 1328, which select one of N internal signal lines, and second stage nanoscale (M/N)-to-1 multiplexers 1310-1313 each receive address lines 1330, which select one of M/N external input signal lines. The nanowire crossbar portion of the factored nanoscale multiplexer circuit is shown enclosed by dotted box 1332.

As an exemplary addressing operation, assume external input signal line 1308 is being addressed. Address lines 1328 selects internal signal line 1316, and places internal signal lines 1317-1319 in a high-impedance state. Address lines 1330 select external input signal line 1308 to be output to internal signal line 1316, and places the remaining external input signal lines within signal-input-line group 1304 in a high-impedance state. The signal is transmitted through second stage nanoscale (M/N)-to-1 multiplexer 1310, and input to first stage N-to-1 multiplexer 1322 via internal signal line 1316. The signal is output from first stage N-to-1 multiplexer 1322 to an amplifier 1324, via external output signal line 1326.

Although the present invention has been described in terms of a particular embodiment, it is not intended that the invention be limited to this embodiment. Modifications within the spirit of the invention will be apparent to those skilled in the art. For example, the number of staggered input signal pads can be varied depending on the size limitations of the factored nanoscale multiplexer/demultiplexer circuit and/or the number of staggered input signal pads used. The number of signal lines connected to each input signal pad can be varied, depending on the desired design of the factored nanoscale multiplexer/demultiplexer circuit. Additionally, more than one first stage multiplexer/demultiplexer may be employed, and the number of internal and external, input and output signal lines incorporated into a first stage multiplexer/demultiplexer can be varied to fit the desired design of the factored nanoscale multiplexer/demultiplexer circuit. The number and type of address lines employed by a first stage multiplexer/demultiplexer can be varied. For example, the first stage address lines may be one-bit or two-bit. Also, various techniques can be employed to construct and randomly deposit switches at signal-line/address-line intersections.

The foregoing detailed description, for purposes of illustration, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description; they are not intended to be exhaustive or to limit the invention to the precise forms disclosed. Obviously many modifications and variation are possible in view of the above teachings. The embodiments were chosen and described in order to best explain the principles of the invention and its practical applications and to thereby enable others skilled in the art to best utilize the invention and various embodiments with various modifications as are suited to the particular use contemplated.

The invention claimed is:

1. A nanoscale electronic device comprising:
   a first-stage external signal line;
   M second-stage external signal lines;
   a deterministic, non-randomly fabricated first-stage multiplexer/demultiplexer connected to
      the first-stage external signal line,
      a number N of internal signal lines, and
      at least $\log_2$ N first-stage address lines; and
   N randomly-fabricated second-stage multiplexers/demultiplexers, each second-stage multiplexer/demultiplexer connected to
      a distinct internal signal line,
      M/N distinct second-stage external signal lines, and
      $\log_2$ (M/N)+S second-stage address lines, where S is a number of supplemental second-stage address lines equal-to or greater-than 1.

2. The nanoscale electronic device of claim 1 wherein the nanoscale electronic device is a demultiplexer that transmits a signal received on the first-stage external signal line to a selected second-stage external signal line.

3. The nanoscale electronic device of claim 1 wherein the nanoscale electronic device is a multiplexer that transmits a signal received on a selected second-stage external signal line to the first-stage external signal line.

4. The nanoscale electronic device of claim 1 wherein each second-stage multiplexer/demultiplexer includes an input signal pad, the input signal pad having M/N nanowire junctions, each nanowire junction interconnecting the input signal pad with one of M/N second-stage external signal lines.

5. The nanoscale electronic device of claim 4 wherein each nanowire junction interconnecting the input signal pad with one of M/N second-stage external signal lines is a conductive-interconnection nanowire junction.

6. The nanoscale electronic device of claim 4 wherein the scale of each input signal pad and each second-stage address line is one of:
   nanoscale;
   sub-microscale; and
   microscale.

7. The nanoscale electronic device of claim 1 wherein the second-stage address lines cross the second-stage external signal lines to form second-stage-address-line/external-signal-line intersections.

8. The nanoscale electronic device of claim 7 wherein approximately half of the second-stage-address-line/external-signal-line intersections include an interconnecting nanowire junction.

9. The nanoscale electronic device of claim 8 wherein each interconnecting nanowire junction is a switch.

10. The nanoscale electronic device of claim 9 wherein the switches are fabricated at randomly selected second-stage-address-line/external-signal-line intersections.

11. The nanoscale electronic device of claim 1 wherein the first-stage address lines are deterministically connected to the first-stage multiplexer/demultiplexer.

12. A method for interfacing a multiplexed external signal line with a number M of demultiplexed external signal lines, the method comprising:
   connecting the multiplexed external signal line with a deterministic, non-randomly fabricated first-stage multiplexer/demultiplexer connected to a number N of internal signal lines, and at least $\log_2$ N first-stage address lines;
   connecting each of the N internal signal lines with a randomly-fabricated second-stage multiplexer/demultiplexer; and
   connecting each second-stage multiplexer/demultiplexer to M/N distinct demultiplexed external signal lines, and $\log_2$ (M/N)+S second-stage address lines, where S is a number of supplemental second-stage address lines equal-to or greater-than 1.

13. The method of claim 12 wherein a signal is transmitted from the multiplexed external signal line to a selected demultiplexed external signal line.

14. The method of claim 12 wherein a signal is transmitted from a selected demultiplexed external signal line to the multiplexed external signal line.

15. The method of claim 12 wherein each second-stage multiplexer/demultiplexer includes an input signal pad, the input signal pad having M/N nanowire junctions, each nanowire junction interconnecting the internal signal pad with one of M/N demultiplexed external signal lines.

16. The method of claim 15 wherein each nanowire junction interconnecting the internal signal pad with one of M/N demultiplexed external signal lines is a conductive-interconnection nanowire junction.

17. The method of claim 15 wherein the scale of each input signal pad and each second-stage address line is one of:
   nanoscale;
   sub-microscale; and
   microscale.

18. The method of claim 12 wherein the second-stage address lines cross the demultiplexed external signal lines to form second-stage-address-line/demultiplexed-external-signal-line intersections.

19. The method of claim 18 wherein approximately half of the second-stage-address-line/demultiplexed-external-signal-line intersections include an interconnecting nanowire junction.

20. The method of claim of claim 19 wherein each interconnecting nanowire junction is a switch.

21. The method of claim 20 wherein the switches are fabricated at randomly selected second-stage-address-line/demultiplexed-external-signal-line intersections.

* * * * *

UNITED STATES PATENT AND TRADEMARK OFFICE
CERTIFICATE OF CORRECTION

PATENT NO.         : 7,292,498 B2
APPLICATION NO.    : 11/123551
DATED              : November 6, 2007
INVENTOR(S)        : Gregory S. Snider Page 1 of 1

It is certified that error appears in the above-identified patent and that said Letters Patent is hereby corrected as shown below:

In column 16, line 55, in Claim 20, delete "of claim" before "19".

Signed and Sealed this

Fourteenth Day of July, 2009

JOHN DOLL
*Acting Director of the United States Patent and Trademark Office*